(12) United States Patent
Nishimura et al.

(10) Patent No.: US 9,899,469 B2
(45) Date of Patent: Feb. 20, 2018

(54) SEMICONDUCTOR DEVICE AND MANUFACTURING METHOD THEREOF

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Shinya Nishimura, Nisshin (JP); Hirokazu Fujiwara, Miyoshi (JP); Narumasa Soejima, Nagakute (JP); Yuichi Takeuchi, Obu (JP)

(73) Assignees: Toyota Jidosha Kabushiki Kaisha, Toyota-shi, Aichi-ken (JP); Denso Corporation, Kariya-shi, Aichi-ken (JP)

( * ) Notice: Subject to any disclaimer, the term of this patent is extended or adjusted under 35 U.S.C. 154(b) by 0 days.

(21) Appl. No.: 15/518,616

(22) PCT Filed: Dec. 11, 2015

(86) PCT No.: PCT/JP2015/006178
§ 371 (c)(1),
(2) Date: Apr. 12, 2017

(87) PCT Pub. No.: WO2016/113797
PCT Pub. Date: Jul. 21, 2016

(65) Prior Publication Data
US 2017/0317162 A1  Nov. 2, 2017

(30) Foreign Application Priority Data

Jan. 15, 2015 (JP) ................................ 2015-005471

(51) Int. Cl.
*H01L 21/265* (2006.01)
*H01L 29/06* (2006.01)
(Continued)

(52) U.S. Cl.
CPC ........ *H01L 29/063* (2013.01); *H01L 21/0465* (2013.01); *H01L 29/1095* (2013.01);
(Continued)

(58) Field of Classification Search
USPC ......................................... 438/521
See application file for complete search history.

(56) References Cited

U.S. PATENT DOCUMENTS 8,704,295 B1 * 4/2014 Darwish ............. H01L 29/7806
257/330
2008/0087951 A1  4/2008 Takaya et al.
(Continued)

FOREIGN PATENT DOCUMENTS

JP  2006-128507  5/2006
WO  WO 2014/115280 A1  7/2014

*Primary Examiner* — Timor Karimy
(74) *Attorney, Agent, or Firm* — Finnegan, Henderson, Farabow, Garrett & Dunner, LLP (57) ABSTRACT

A semiconductor device includes a p-type semiconductor region in contact with a bottom face of a trench gate, wherein the p-type semiconductor region includes a first p-type semiconductor region containing a first type of p-type impurities and a second p-type semiconductor region containing a second type of p-type impurities. The first p-type semiconductor region is located between the trench gate and the second p-type semiconductor region. In a view along the depth direction, the second p-type semiconductor region is located within a part of the first p-type semiconductor region. A diffusion coefficient of the second type of p-type impurities is smaller than a diffusion coefficient of the first type of p-type impurities.

3 Claims, 6 Drawing Sheets (51) Int. Cl.
*H01L 29/16* (2006.01)
*H01L 29/78* (2006.01)
*H01L 29/10* (2006.01)
*H01L 29/66* (2006.01)
*H01L 21/04* (2006.01)

(52) U.S. Cl.
CPC .... *H01L 29/1608* (2013.01); *H01L 29/66068* (2013.01); *H01L 29/7813* (2013.01)

(56) References Cited

U.S. PATENT DOCUMENTS

| | | | |
|---|---|---|---|
| 2009/0166730 A1* | 7/2009 | Okuno | H01L 29/0623 257/330 |
| 2010/0258815 A1 | 10/2010 | Tarui | |
| 2014/0295633 A1* | 10/2014 | Onogi | H01L 29/66068 438/270 |
| 2016/0005861 A1 | 1/2016 | Nishimura et al. | |

* cited by examiner

SEMICONDUCTOR DEVICE AND MANUFACTURING METHOD THEREOF

CROSS-REFERENCE TO RELATED APPLICATIONS

This application is a national phase application of International Application No. PCT/JP2015/006178, filed Dec. 11, 2015, and claims the priority of Japanese Application No. 2015-005471, filed Jan. 15, 2015, the content of both of which is incorporated herein by reference.

TECHNICAL FIELD

This application claims priority to Japanese Patent Application No. 2015-005471 filed on Jan. 15, 2015, the contents of which are hereby incorporated by reference into the present application.

The technique disclosed in the present application relates to a semiconductor device comprising a p-type semiconductor region in contact with a bottom surface of a trench gate, and a method of manufacturing the same.

BACKGROUND ART

Patent Literature 1 discloses a semiconductor device including a p-type semiconductor region in contact with a bottom face of a trench gate. The p-type semiconductor region relaxes an electric field applied to the bottom face of the trench gate and improves a withstand voltage of the semiconductor device.

CITATION LIST

Patent Literature

[Patent Literature 1] Japanese Patent Application Publication No. 2006-128507

SUMMARY OF INVENTION

In conventional techniques, a p-type semiconductor region is formed by forming a trench extending along a depth direction from one of main surfaces of a semiconductor layer, and then irradiating p-type impurities toward the trench. In order to prevent the p-type impurities from being introduced to a side face of the trench when the p-type impurities are irradiated toward the trench, a protective film is formed on the side face of the trench. The p-type impurities are not introduced to an edge part of the bottom face of the trench, and introduced to a central part of the bottom face of the trench due to a thickness of the protective film.

It is preferable that the p-type semiconductor region is not only formed under the edge of the bottom face of the trench gate, but also formed at a deeper position under the bottom face of the trench gate in order to relax an electric field applied to the bottom face of the trench gate.

In the conventional techniques, a p-type semiconductor region that satisfies these conditions is formed by thermal diffusion of a single type of p-type impurities having a relatively large diffusion coefficient. The p-type semiconductor region formed by such thermal diffusion, however, spreads isotropically and hence spreads along a lateral direction unnecessarily at the deeper position under the bottom face of the trench gate, resulting in an increase in on-resistance of the semiconductor device.

As described above, a configuration required for a p-type semiconductor region is preferably a configuration that the p-type semiconductor region spreads, at a shallower position under the bottom face of the trench gate, along the lateral direction so as to be located under the edge of the bottom face of the trench gate, whereas the p-type semiconductor region spreads, at the deeper position under the bottom face of the trench gate, along a depth direction, with its spreading along the lateral direction being suppressed, in other words, a T-shape configuration in cross section as a whole. It is, however, difficult for a p-type semiconductor region formed with a single type of p-type impurities having a relatively large diffusion coefficient, to have such configuration.

The present specification provides a technique that improves both of a withstand voltage and an on-resistance in a semiconductor device that comprises a p-type semiconductor region in contact with a bottom face of a trench gate.

A semiconductor device disclosed in the present specification comprises a trench gate and a p-type semiconductor region. The trench gate extends from one of main surfaces of a semiconductor layer along a depth direction. The p-type semiconductor region is in contact with a bottom face of the trench gate. The p-type semiconductor region includes a first p-type semiconductor region containing a first type of p-type impurities and a second p-type semiconductor region containing a second type of p-type impurities. The first p-type semiconductor region is located between the trench gate and the second p-type semiconductor region. In a view along the depth direction, the second p-type semiconductor region is located within a part of the first p-type semiconductor region. A diffusion coefficient of the second type of p-type impurities is smaller than a diffusion coefficient of the first type of p-type impurities.

In the above-described semiconductor device, the p-type semiconductor region is formed with two types of p-type impurities having different diffusion coefficients. The first p-type semiconductor region that contains a first type of p-type impurities having a relatively large diffusion coefficient is formed at a shallower position under the bottom face of the trench, and the second p-type semiconductor region that contains the second type of p-type impurities having a relatively small diffusion coefficient is formed at a deeper position under the bottom face of the trench. The p-type semiconductor region can thereby have a configuration in which it spreads, at the shallower position under the bottom face of the trench, along a lateral direction, whereas it spreads, at the deeper position under the bottom face of the trench, along a depth direction with its spreading along the lateral direction being suppressed. The semiconductor device can have a feature of a high withstand voltage and a low on-resistance.

A manufacturing method of a semiconductor device disclosed in the present specification comprises forming a mask, forming a trench, irradiating a first type of p-type impurities and irradiating a second type of p-type impurities. In the forming of the mask, the mask is formed on one of main surfaces of a semiconductor layer, wherein an opening is formed in the mask. In the forming of the trench, the trench is formed to extend along a depth direction from the one of main surfaces which is exposed at the opening of the mask. In the irradiating of the first type of p-type impurities, the first type of p-type impurities is irradiated through the opening and toward the trench. In the irradiating of the second type of p-type impurities, the second type of p-type impurities is irradiated through the opening and toward the trench. The second type of p-type impurities is introduced to a deeper position under a bottom face of the trench than the first type of p-type impurities. A diffusion coefficient of the second type of p-type impurities is smaller than a diffusion coefficient of the first type of p-type impurities.

According to the above-described manufacturing method, the first type of p-type impurities and the second type of p-type impurities are introduced under the bottom face of the trench, with the use of a common mask. This makes it possible to form a p-type semiconductor region that has the configuration in which it spreads, at a shallower position under the bottom face of the trench, along a lateral direction, whereas it spreads, at a deeper position under the bottom face of the trench, along a depth direction with its spreading along the lateral direction being suppressed. According to the above-described manufacturing method, it is therefore possible to manufacture a semiconductor device that comprises a p-type semiconductor region having such configuration.

DESCRIPTION OF EMBODIMENTS

Figure 1:
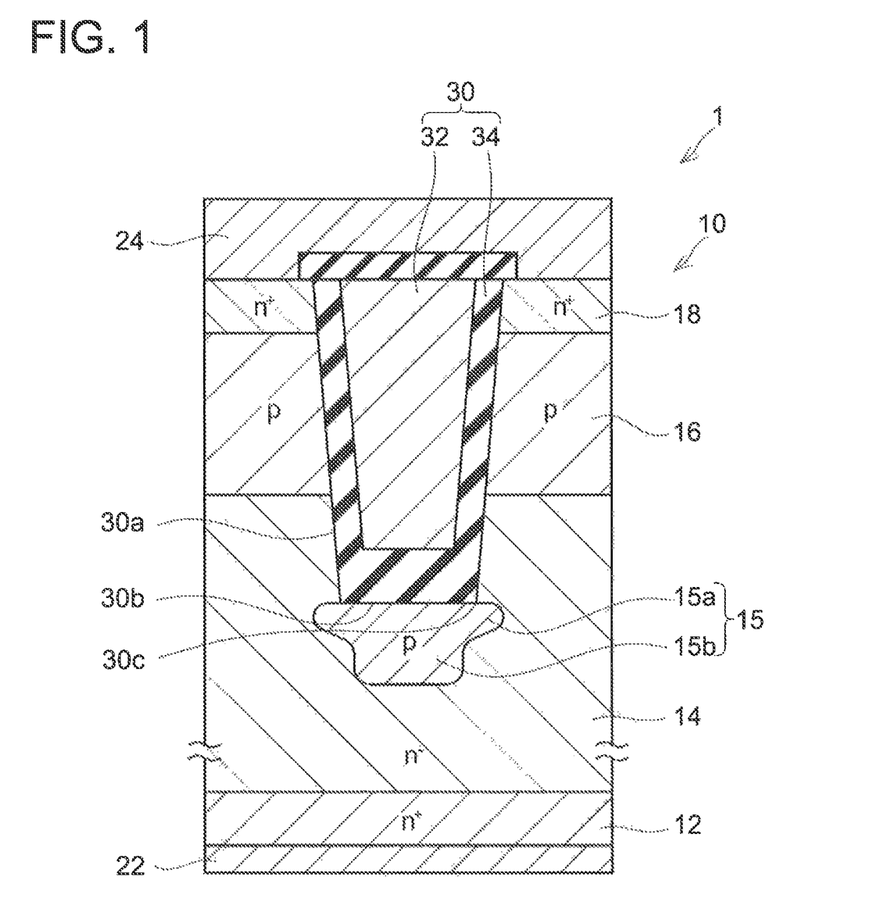
FIG. 1 schematically shows a cross section of a main part of a semiconductor device.

As shown in FIG. 1, a semiconductor device 1 comprises a semiconductor layer 10 made of silicon carbide, a drain electrode 22 that covers a rear surface of the semiconductor layer 10, a source electrode 24 that covers a front surface of the semiconductor layer 10, and a trench gate 30 provided at a front layer part of the semiconductor layer 10. The trench gate 30 extends from the front surface of the semiconductor layer 10 along a depth direction (a direction orthogonal to the front surface of the semiconductor layer 10, i.e., a direction from a top to a bottom on the paper). Although FIG. 1 shows only one trench gate 30, the semiconductor layer 10 is provided with a plurality of trench gates 30. In a view along the depth direction of the semiconductor layer 10 (in a planar view of the semiconductor layer 10), the plurality of trench gates 30 may be arranged in a stripe-shaped manner, or may be interspersed like islands. Each trench gate 30 includes a gate electrode 32 and a gate insulating film 34. The gate insulating film 34 covers the gate electrode 32.

The semiconductor layer 10 includes an $n^+$-type drain region 12, an $n^-$-type drift region 14, a p-type semiconductor region 15, a p-type body region 16, and an $n^+$-type source region 18. The drain region 12 is provided at a rear layer part of the semiconductor layer 10, and is in ohmic contact with the drain electrode 22. The drift region 14 is provided between the drain region 12 and the body region 16, and is in contact with a side face 30a of the trench gate 30. The drift region 14 is a remaining part that is obtained after other semiconductor regions are formed in the semiconductor layer 10. The p-type semiconductor region 15 is in contact with a bottom face 30b of the trench gate 30. The p-type semiconductor region 15 in this example is separated from the body region 16 by the drift region 14, and has a floating potential. As an alternative to this example, a p-type semiconductor region 15 may be configured to be in contact with a body region 16. The body region 16 is provided at the front layer part of the semiconductor layer 10, is provided between the drift region 14 and the source region 18, and is in contact with the side face 30a of the trench gate 30. The body region 16 is electrically connected to the source electrode 24 via a $p^+$-type body contact region provided at a part of the cross section not shown. The source region 18 is provided at the front layer part of the semiconductor layer 10, is in contact with the side face 30a of the trench gate 30, and is in ohmic contact with the source electrode 24. As such, a semiconductor structure that configures a MOSFET is provided in the semiconductor layer 10.

The p-type semiconductor region 15 includes a first p-type semiconductor region 15a and a second p-type semiconductor region 15b. The first p-type semiconductor region 15a is in contact with the bottom face 30b of the trench gate 30, and is provided at a shallower position under the bottom face 30b of the trench gate 30. The first p-type semiconductor region 15a has a width larger than a width of the second p-type semiconductor region 15b, along a width direction of the trench gate 30 (a direction connecting portions of side face 30a that face each other, hereinafter also referred to as a lateral direction). The second p-type semiconductor region 15b is in contact with the first p-type semiconductor region 15a, and is provided at a deeper position under the bottom face 30b of the trench gate 30. The first p-type semiconductor region 15a has boron introduced thereto as p-type impurities, and the second p-type semiconductor region 15b has aluminum introduced thereto as p-type impurities. In silicon carbide, boron has a diffusion coefficient larger than a diffusion coefficient of aluminum. Note that the first p-type semiconductor region 15a preferably contains boron at a concentration of at least equal to or more than $1\times10^{16}$ cm$^{-3}$, and in an example, the first p-type semiconductor region 15a is defined as containing boron at a concentration ranging from $1\times10^{16}$ to $1\times10^{18}$ cm$^{-3}$. Similarly, the second p-type semiconductor region 15b preferably contains aluminum at a concentration of at least equal to or more than $1\times10^{16}$ cm$^{-3}$, and in an example, the second p-type semiconductor region 15b is defined as containing aluminum at a concentration ranging from $1\times10^{16}$ to $1\times10^{18}$ cm$^{-3}$.

The first p-type semiconductor region 15a is also located under an edge 30c of the bottom face 30b of the trench gate 30, and projects out in a lateral direction from the edge 30c of the bottom face 30b of the trench gate 30. The second p-type semiconductor region 15b is located within a part of the first p-type semiconductor region 15a, in a view along the depth direction of the semiconductor layer 10. Moreover, the second p-type semiconductor region 15b is located within a part of the bottom face 30b of the trench gate 30, in the view along the depth direction of the semiconductor layer 10. As such, the p-type semiconductor region 15 has a configuration in which it spreads, at the shallower position under the bottom face 30b of the trench gate 30, along the lateral direction so as to be located under the edge 30c of the bottom face 30b of the trench gate 30, whereas it spreads, at the deeper position under the bottom face 30b of the trench gate 30, along the depth direction with its spreading along the lateral direction being suppressed, in other words, a T-shape configuration in cross section as a whole.

Figure 2:
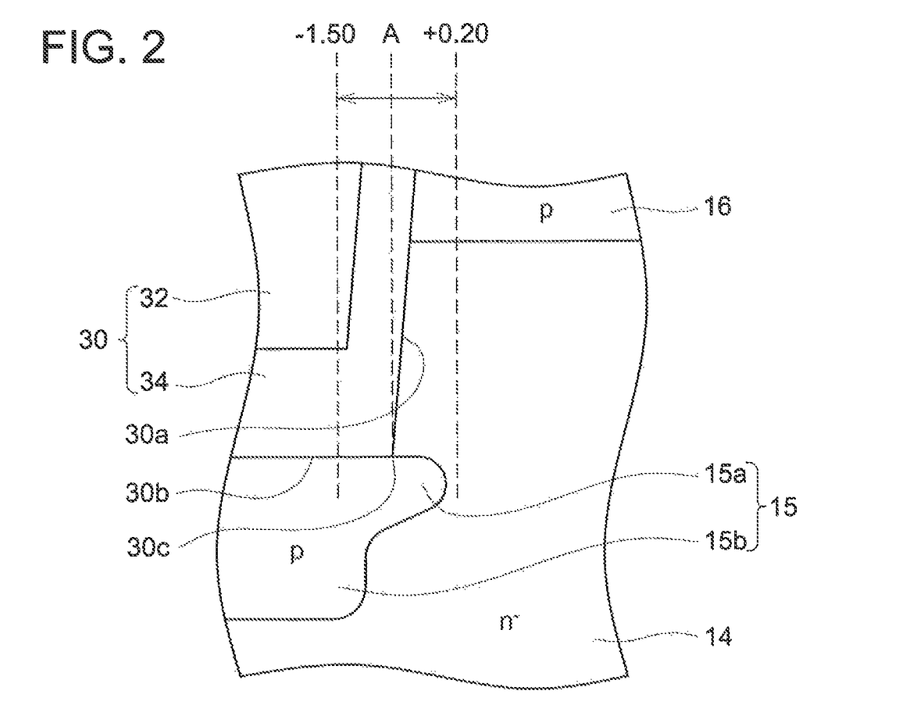
FIG. 2 schematically shows an enlarged view of vicinity of an edge of a bottom face of a trench gate.
Figure 3:
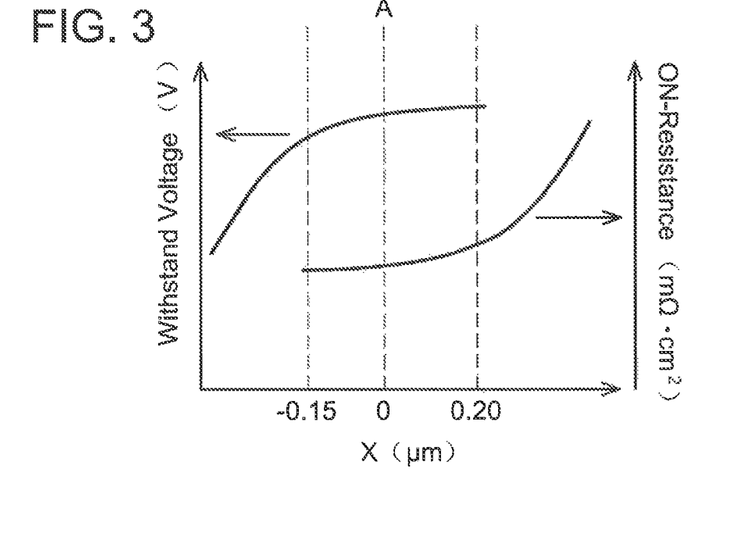
FIG. 3 shows a relation between spreading of a p-type semiconductor region along a lateral direction and a withstand voltage of the semiconductor device, and a relation between spreading of the p-type semiconductor region along the lateral direction and an on-resistance of the semiconductor device.

FIGS. 2 and 3 show how the spreading of the first p-type semiconductor region 15a along the lateral direction affects a withstand voltage and an on-resistance of the semiconductor device 1. When the edge 30c of the bottom face 30b of the trench gate 30 is set as a reference A, a distance along the width direction of the trench gate 30 is set as X, and an orientation in which the first p-type semiconductor region 15a projects out along the lateral direction from the edge 30c of the bottom face 30b of the trench gate 30 is set positive, and a reverse orientation thereof is set negative. As shown in FIG. 3, in a range from −0.15 mm to +0.20 mm with respect to the reference A, the withstand voltage of the semiconductor device 1 is maintained high, and the on-resistance of the semiconductor device 1 is maintained low. In particular, in a case where the orientation is positive with respect to the reference A and the distance is equal to or smaller than 0.20 mm, in other words, in a case where the first p-type semiconductor region 15a projects out along the lateral direction from the edge 30c of the bottom face 30b of the trench gate 30 and a length by which the first p-type semiconductor region 15a projects out is equal to or smaller than 0.20 mm, the semiconductor device 1 can have superior characteristics in both the withstand voltage and the on-resistance.

In addition, the first p-type semiconductor region 15a is not in contact with the side face 30a of the trench gate 30. The side face 30a of the trench gate 30 is a part where a channel is formed when the semiconductor device 1 is on. Although the semiconductor device 1 includes the p-type semiconductor region 15, the p-type semiconductor region 15 does not exist at this part where the channel is formed, resulting in that an increase in on-resistance is suppressed.

The second p-type semiconductor region 15b has a width, along the lateral direction, smaller than the width of the first p-type semiconductor region 15a. For example, the p-type semiconductor region in the conventional techniques is formed by isotropic thermal diffusion, and hence has a configuration of being spread widely along the lateral direction at a depth corresponding to a depth of the second p-type semiconductor region 15b. Thus in the conventional semiconductor device, a current path of a current flowing in the drift region becomes narrow, resulting in an increase in on-resistance. On the other hand, in the semiconductor device 1, the spreading of the second p-type semiconductor region 15b along the lateral direction has been suppressed, and hence a wide current path of the current flowing in the drift region 14 is ensured, resulting in a low on-resistance. Moreover, the second p-type semiconductor region 15b has a configuration of being spread along the depth direction, resulting in that the withstand voltage of the semiconductor device 1 is maintained high.

A manufacturing process of forming a p-type semiconductor region 15 in a manufacturing method of a semiconductor device 1 will now be described. As for manufacturing processes other than the process of forming the p-type semiconductor region 15, known manufacturing steps can be utilized to manufacture the semiconductor device 1.

Figure 4:
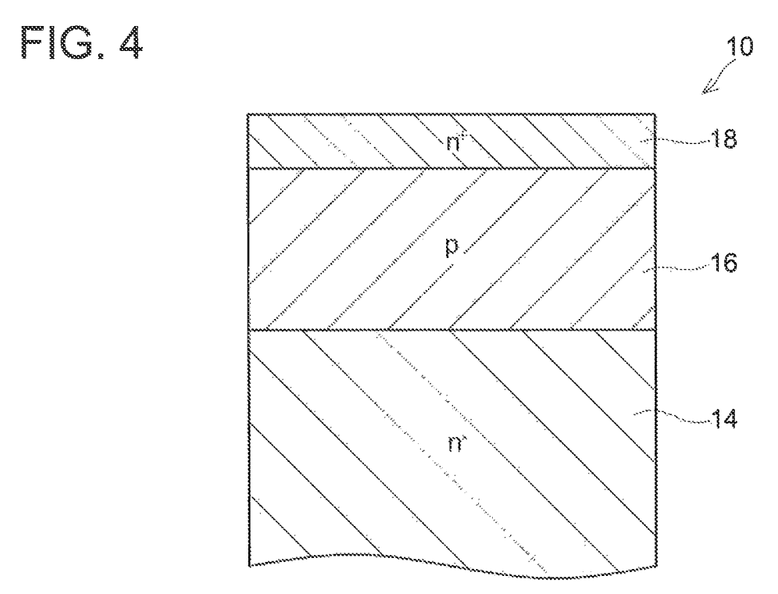
FIG. 4 shows a process of a manufacturing of a p-type semiconductor region in a manufacturing method of a semiconductor device.

Initially, as shown in FIG. 4, a semiconductor layer 10 made of silicon carbide is prepared. A body region 16 and a source region 18 have been formed at a front layer part of the semiconductor layer 10.

Figure 5:
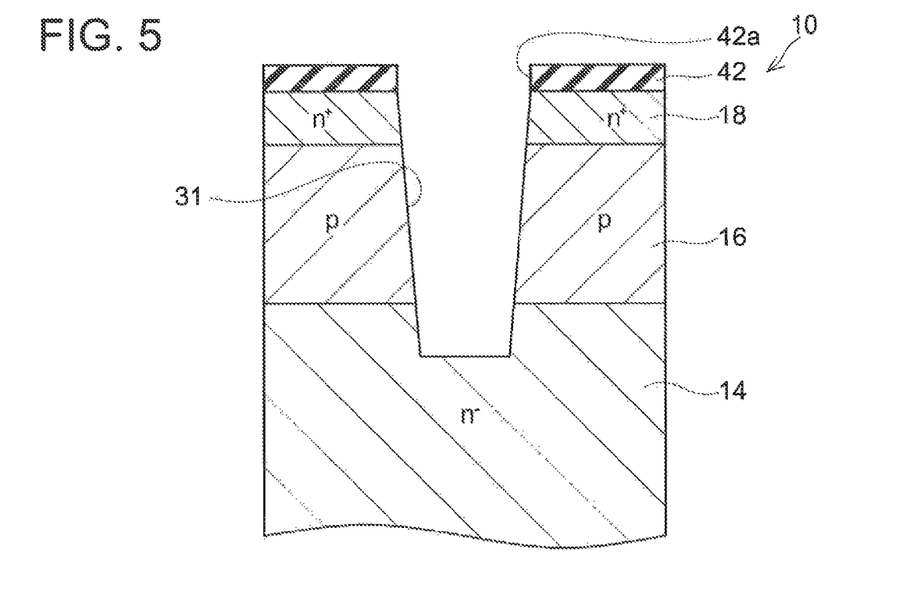
FIG. 5 shows a process of the manufacturing of the p-type semiconductor region in the manufacturing method of the semiconductor device.

Next, as shown in FIG. 5, a TEOS film 42 is deposited on a front surface of the semiconductor layer 10 with the use of a CVD. The TEOS film 42 has a thickness of approximately 1.5 mm. Note that the TEOS film 42 is an example of a mask according to the appended claims. Next, an opening 42a is formed in the TEOS film 42 to expose the front surface of the semiconductor layer 10. Next, a trench 31 that extends along a depth direction from the front surface of the semiconductor layer 10, the front surface being exposed at the opening 42a of the TEOS film 42, is formed with the use of a dry-etching technique. The trench 31 has a side face inclined relative to the depth direction, and has a tapered shape in cross section. The trench 31 penetrates the source region 18 and the body region 16 to reach the drift region 14.

Figure 6:
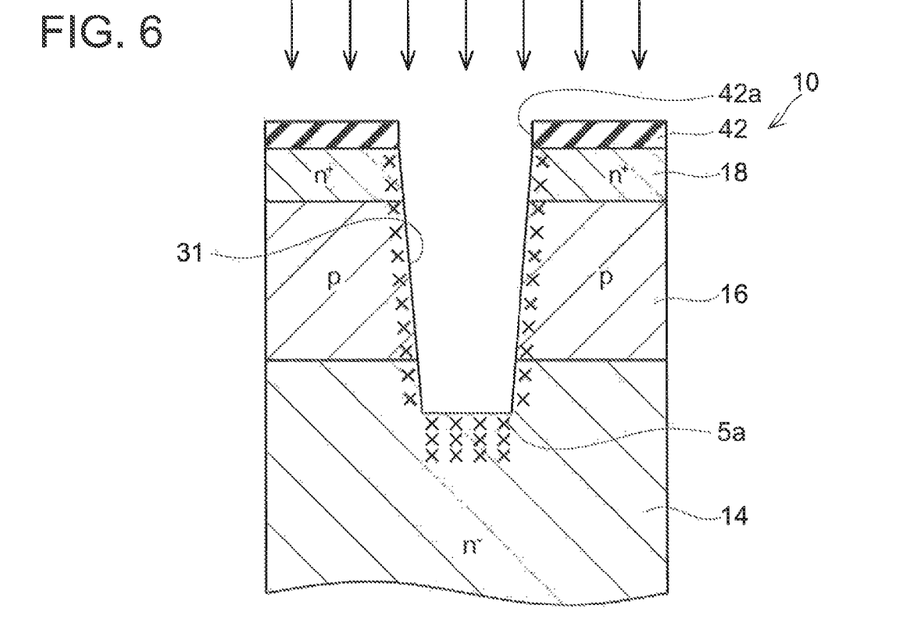
FIG. 6 shows a process of the manufacturing of the p-type semiconductor region in the manufacturing method of the semiconductor device.

Next, as shown in FIG. 6, boron ions 5a are irradiated toward the trench 31 through the opening 42a of the TEOS film 42 with the use of an ion implantation technique. The boron ions 5a have a low implantation energy of 60 to 240 keV, and are irradiated in a dose of 2.0 to $2.5 \times 10^{15}$ cm$^{-2}$. The boron ions 5a are irradiated in a multistage manner under the bottom face of the trench 31, so as to have a depth of equal to or smaller than 0.4 mm. At this time, the boron ions 5a are also introduced to the side face of the trench 31.

Figure 7:
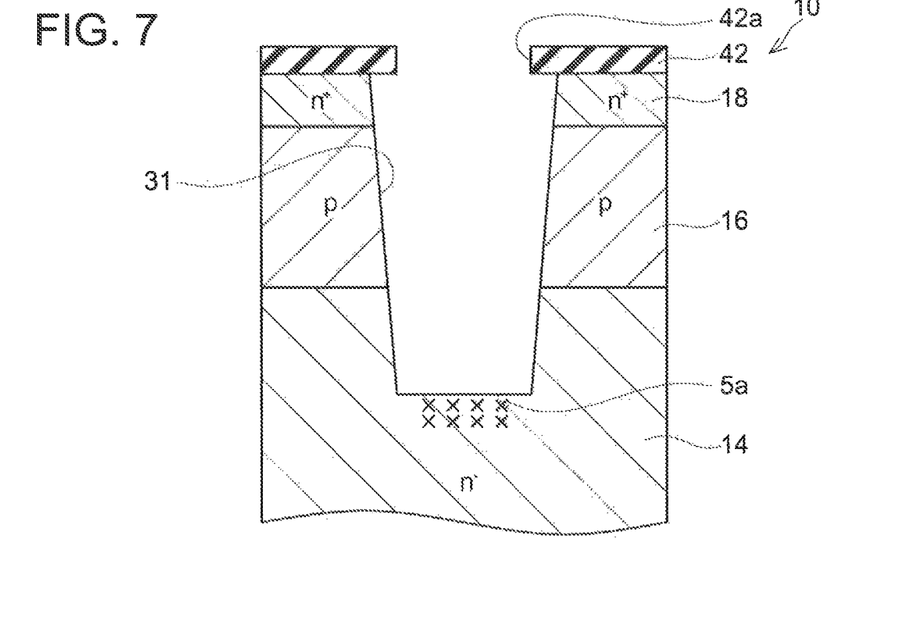
FIG. 7 shows a process of the manufacturing of the p-type semiconductor region in the manufacturing method of the semiconductor device.

Next, as shown in FIG. 7, a part of the side and bottom faces of the trench 31 is cut with the use of a chemical dry-etching. A thickness to be cut is approximately 60 nm. Most or all of a part of the side face of the trench 31 where the boron ions have been introduced is thereby removed by cutting. As for the bottom face of the trench 31, most of a part where the boron ions have been introduced remains as it is. A concentration of the p-type impurities in the side face of the trench 31 is lowered to a concentration ($5.0 \times 10^{15}$ cm$^{-3}$) that provides a desired threshold voltage when compared to the concentration before the etching.

Figure 8:
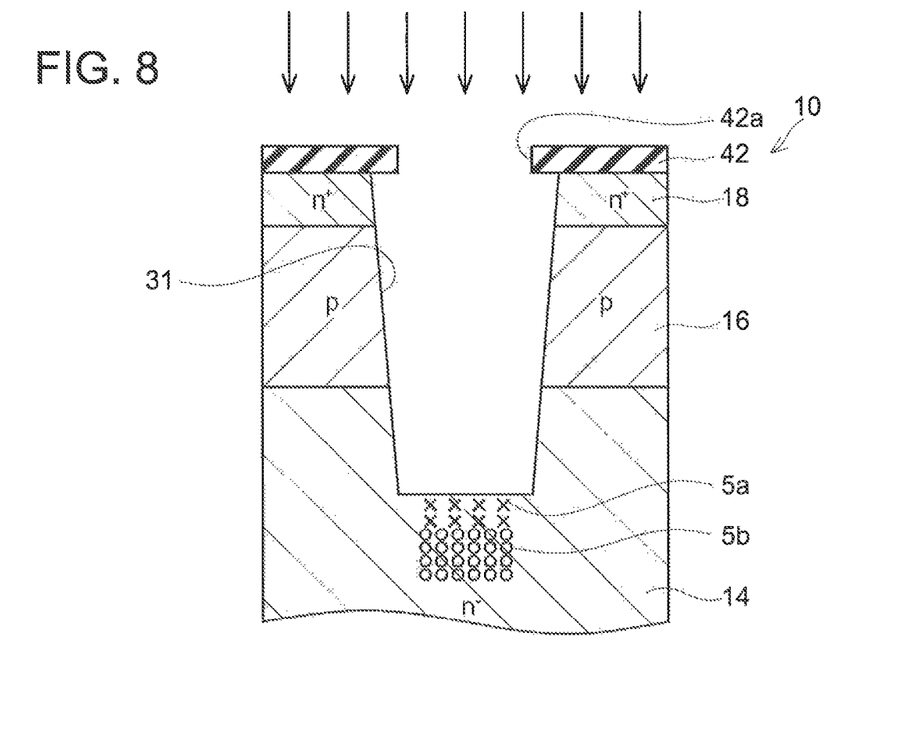
FIG. 8 shows a process of the manufacturing of the p-type semiconductor region in the manufacturing method of the semiconductor device.

Next, as shown in FIG. 8, aluminum ions 5b are irradiated toward the trench 31 through the opening 42a of the TEOS film 42 with the use of an ion implantation. The aluminum ions 5b have a high implantation energy of 240 to 900 keV, and are irradiated in a dose of 2.0 to $2.5 \times 10^{13}$ cm$^{-2}$. The aluminum ions 5b are irradiated in a multistage manner, so as to have a depth ranging from 0.3 to 0.8 mm under the bottom face of the trench 31. Due to the cutting, the side face of the trench 31 is located at a position retracted from a plane that defines the opening 42a of the TEOS film 42. The side face of the trench 31 is therefore shielded by the TEOS film 42, in a view along a direction along which the aluminum ions 5b are irradiated. Accordingly, the aluminum ions 5b are not introduced to the side face of the trench 31, and selectively introduced to the bottom face of the trench 31.

Figure 9:
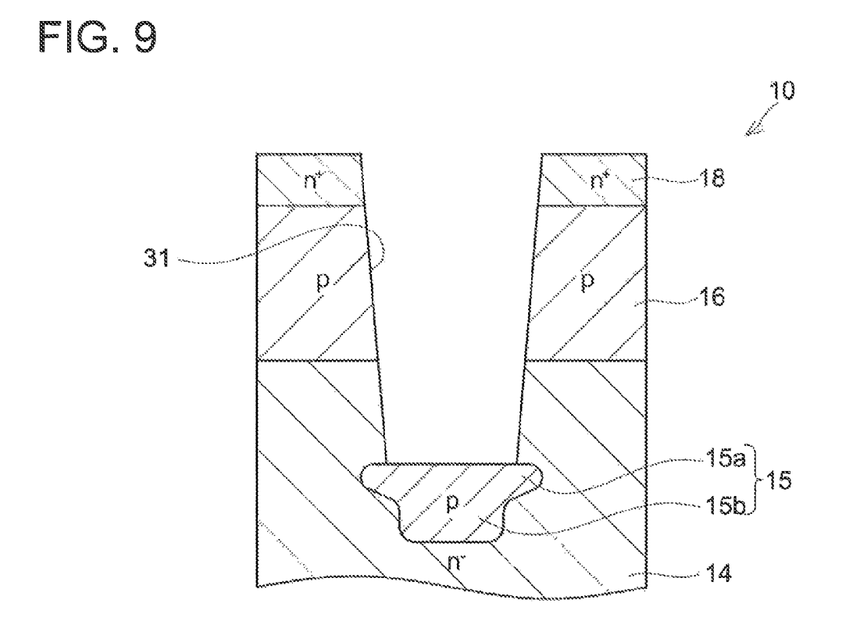
FIG. 9 shows a process of the manufacturing of the p-type semiconductor region in the manufacturing method of the semiconductor device.

Next, as shown in FIG. 9, activation annealing is performed after the TEOS film 42 is removed, so as to activate the boron ions 5a and the aluminum ions 5b having been introduced. A region where the boron ions 5a are activated serves as a first p-type semiconductor region 15a, whereas a region where the aluminum ions 5b are activated serves as a second p-type semiconductor region 15b, and a p-type semiconductor region 15 is thereby formed. At this time, the boron ions 5a have a large diffusion coefficient, and are thermally diffused by approximately 0.2 mm. On the other hand, the aluminum ions 5b have a small diffusion coefficient, and are hardly diffused. This allows the p-type semiconductor region 15 to have a T-shape configuration in cross section.

In the above-described manufacturing method, aluminum ions, which have a small diffusion coefficient, are introduced at a deeper position under the bottom face of the trench 31. This makes it possible to form the second p-type semiconductor region 15b at the deeper position under the bottom face of the trench 31, and hence it is not necessary to cause boron ions of which diffusion coefficient is large, to be thermally diffused widely along the depth direction. For example, in the conventional manufacturing method, it is necessary to cause boron ions of which diffusion coefficient is large, to be thermally diffused widely along the depth direction, resulting in that the boron ions are thermally diffused widely along the lateral direction unnecessarily. On the other hand, in the above-described manufacturing method, boron ions of which diffusion coefficient is large, only need to be introduced to a shallower position under the bottom face of the trench 31. In the above-described manufacturing method, it is possible to cause the boron ions, which have been introduced to the shallower position under the bottom face of the trench 31, to be thermally diffused at a desired position under the edge of the bottom face of the trench 31, without causing them to be thermally diffused widely along the depth direction. In addition, in the above-described manufacturing method, it is not necessary to cause the boron ions to be thermally diffused unnecessarily, and hence the activation annealing can be controlled such that the boron ions do not come into contact with the side face 30a of the trench gate 30. The above-described manufacturing method can thereby provide a semiconductor device in which an increase in on-resistance is suppressed.

Some advantages of the technique disclosed in the present specification are summarized below. Matters described below have independently technical usefulness.

The technique disclosed in the present specification may be applied to various kinds of semiconductor devices comprising a trench gate. For example, the technique disclosed in the present specification may be applied to a MOSFET or an IGBT. One embodiment of a semiconductor device disclosed in the present specification may comprise a trench gate and a p-type semiconductor region. The trench gate may extend from one of main surfaces of a semiconductor layer along a depth direction. A configuration of the trench gate may not be especially limited, and a layout of the trench gate may not be especially limited. The p-type semiconductor region may be in contact with a bottom face of the trench gate. The p-type semiconductor region may include a first p-type semiconductor region containing a first type of p-type impurities and a second p-type semiconductor region containing a second type of p-type impurities. The first p-type semiconductor region may be located between the trench gate and the second p-type semiconductor region. An additional semiconductor region may be provided between the first p-type semiconductor region and the bottom face of the trench gate and/or between the first p-type semiconductor region and the second p-type semiconductor region. In a view along the depth direction, the second p-type semiconductor region may be located within a part of the first p-type semiconductor region. A diffusion coefficient of the second type of p-type impurities may be smaller than a diffusion coefficient of the first type of p-type impurities.

The first p-type semiconductor region may be in contact with the bottom face of the trench gate, and may project out along a lateral direction from an edge of the bottom face of the trench gate. In this embodiment, an electric field at the edge of the bottom face of the trench gate is relaxed, and a withstand voltage of the semiconductor device is accordingly improved. Further, in this embodiment, it is preferable that a length by which the first p-type semiconductor region projects out along the lateral direction from the edge of the bottom face of the trench gate is equal to or smaller than 0.2 mm. In this embodiment, even if a p-type semiconductor region is provided, an increase in on-resistance of the semiconductor device is suppressed. Further, in this embodiment, it is preferable that the first p-type semiconductor region is not in contact with a side face of the trench gate. In this embodiment also, even if a p-type semiconductor region is provided, an increase in on-resistance of the semiconductor device is suppressed.

In a view along the depth direction, the second p-type semiconductor region may be located within a part of the trench gate. In this embodiment, at a deeper position under the bottom face of the trench gate, spreading of the second p-type semiconductor region along the lateral direction is suppressed. Therefore, even if a p-type semiconductor region is provided, a wide current path is ensured and an increase in on-resistance of the semiconductor device is suppressed.

A manufacturing method of a semiconductor device disclosed in the present specification may comprise forming a mask, forming a trench, irradiating a first type of p-type impurities, and irradiating a second type of p-type impurities. In the forming of the mask, the mask is formed on one of main surfaces of a semiconductor layer, wherein an opening is formed in the mask. In the forming of the trench, the trench is formed to extend along a depth direction from the one of main surfaces which is exposed at the opening of the mask. In the irradiating of the first type of p-type impurities, the first type of p-type impurities is irradiated through the opening and toward the trench. In the irradiating of the second type of p-type impurities, the second type of p-type impurities is irradiated through the opening and toward the trench. A performing order in which the irradiating of the first type of p-type impurities and the irradiating of the second type of p-type impurities are performed earlier or later, may not be especially limited. The second type of p-type impurities is introduced to a deeper position under a bottom face of the trench than the first type of p-type impurities. A diffusion coefficient of the second type of p-type impurities is smaller than a diffusion coefficient of the first type of p-type impurities.

The irradiating of the first type of p-type impurities may be performed prior to the irradiating of the second type of p-type impurities. In this case, the manufacturing method of the semiconductor device may further comprise removing side and bottom faces of the trench, in a state where the mask is maintained, so as to maintain the first type of p-type impurities having been introduced under the bottom face of the trench, wherein the removing is performed between the irradiating of the first type of p-type impurities and the irradiating of the second type of p-type impurities. According to this manufacturing method, in the irradiating of the second type of p-type impurities, the side face of the trench is shield by the mask so that the second type of p-type impurities is prevented from being irradiated to the side face of the trench.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A manufacturing method of a semiconductor device, the method comprising:
    forming a mask on one of main surfaces of a semiconductor layer, wherein an opening is formed in the mask;
    forming a trench extending along a depth direction from the one of main surfaces which is exposed at the opening of the mask, wherein the trench has a tapered shape;
    irradiating a first type of p-type impurities through the opening and toward the trench;
    removing side and bottom faces of the trench, in a state where the mask is maintained, so as to maintain the first type of p-type impurities having been introduced under the bottom face of the trench;
    irradiating a second type of p-type impurities through the opening and toward the trench after the irradiating the first type of p-type impurities and the removing side and bottom faces of the trench; and
    annealing the semiconductor layer so as to activate the first type of p-type impurities and the second type of p-type impurities,
    wherein
    the second type of p-type impurities is introduced to a deeper position under a bottom face of the trench than the first type of p-type impurities, and
    a diffusion coefficient of the second type of p-type impurities is smaller than a diffusion coefficient of the first type of p-type impurities.

2. The manufacturing method of a semiconductor device according to claim 1, wherein
    a first p-type semiconductor region containing the first type of p-type impurities is in contact with the bottom face of the trench, and projects out along a lateral direction from an edge of the bottom face of the trench gate.

3. The manufacturing method of a semiconductor device according to claim 1, wherein
    in a view along the depth direction, a second p-type semiconductor region containing the second type of p-type impurities is located within a part of the trench.

* * * * *